(12) United States Patent
Peev et al.

(10) Patent No.: US 10,976,184 B2
(45) Date of Patent: Apr. 13, 2021

(54) SENSOR DIAGNOSTIC DEVICE AND METHOD

(71) Applicant: Melexis Bulgaria Ltd., Sofia (BG)

(72) Inventors: Rumen Marinov Peev, Sofia (BG); Stoyan Georgiev Gaydov, Sofia (BG); Tsvetan Miroslavov Marinov, Sofia (BG)

(73) Assignee: MELEXIS BULGARIA LTD., Sofia (BG)

( * ) Notice: Subject to any disclaimer, the term of this patent is extended or adjusted under 35 U.S.C. 154(b) by 16 days.

(21) Appl. No.: 16/665,668

(22) Filed: Oct. 28, 2019

(65) Prior Publication Data
US 2020/0132514 A1    Apr. 30, 2020

(30) Foreign Application Priority Data
Oct. 29, 2018   (EP) .................................... 18203034

(51) Int. Cl.
| | |
|---|---|
| *G01R 33/00* | (2006.01) |
| *G01D 5/244* | (2006.01) |
| *G01D 5/14* | (2006.01) |
| *G01R 33/07* | (2006.01) |
| *H01L 43/04* | (2006.01) |

(52) U.S. Cl.
CPC ......... *G01D 5/24466* (2013.01); *G01D 5/142* (2013.01); *G01R 33/0023* (2013.01); *G01R 33/07* (2013.01); *H01L 43/04* (2013.01)

(58) Field of Classification Search
CPC ..... G01D 5/142; G01R 33/0023; G01R 33/07
See application file for complete search history.

(56) References Cited

U.S. PATENT DOCUMENTS

| | | |
|---|---|---|
| 7,622,367 B1 | 11/2009 | Nuzzo et al. |
| 8,506,867 B2 | 8/2013 | Menard et al. |
| | (Continued) | |

FOREIGN PATENT DOCUMENTS

WO    2015038564 A1    3/2015

OTHER PUBLICATIONS

Cok et al., "AMOLED Displays with Transfer-Printed Integrated Circuits," Journal of the Society for Information Display, 2011, pp. 335-341.

(Continued)

*Primary Examiner* — Alvaro E Fortich
(74) *Attorney, Agent, or Firm* — Workman Nydegger

(57) ABSTRACT

A sensor device includes a sensor for sensing amounts of a physical quantity, such as an environmental attribute, and providing sensor signals formed in response to the sensed physical quantity. A diagnostic test circuit provides multiple diagnostic test signals each representing a desired response to a particular amount of the physical quantity. A signal circuit selects the sensor signal or the diagnostic test signal and forms a signal circuit output. A reference circuit provides a calibrated reference signal corresponding to a threshold amount of the physical quantity. A comparator receives and compares the calibrated reference signal and the signal circuit output to form a comparison signal. A control circuit controls the signal circuit, reference circuit, and diagnostic test circuit and receives the comparison signal to output a sensor device sensor signal or sensor device diagnostic signal.

15 Claims, 4 Drawing Sheets

(56) References Cited

U.S. PATENT DOCUMENTS

| | | |
|---|---|---|
| 8,722,458 B2 | 5/2014 | Rogers et al. |
| 9,520,537 B2 | 12/2016 | Bower et al. |
| 2009/0251134 A1* | 10/2009 | Uenoyama ......... G01D 5/24466 |
| | | 324/207.21 |
| 2015/0070007 A1* | 3/2015 | Kurniawan ............ G01R 35/00 |
| | | 324/251 |
| 2015/0372053 A1 | 12/2015 | Bower et al. |
| 2016/0093600 A1 | 3/2016 | Bower et al. |
| 2016/0232724 A1* | 8/2016 | Peev ........................ G01D 3/08 |
| 2016/0252599 A1* | 9/2016 | Motz ................... G01R 33/075 |
| | | 324/251 |
| 2016/0299200 A1 | 10/2016 | Taylor et al. |

OTHER PUBLICATIONS

European Search Report from EP Application No. 18203034.6, dated Apr. 29, 2019.

\* cited by examiner

SENSOR DIAGNOSTIC DEVICE AND METHOD

FIELD OF THE INVENTION

The present invention relates to integrated sensor device diagnostic structures, circuits, and methods.

BACKGROUND OF THE INVENTION

Sensors are widely used in electronic devices to measure physical quantities (for example attributes of the environment) and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field. In many applications, it is desirable that magnetic sensors are small and are integrated with electronic processing circuitry so as to reduce the overall magnetic sensor size and provide improved measurements and integration into external electronic systems. For example, U.S. Patent Publication No 20160299200 describes a Hall-effect magnetic sensor for measuring magnetic fields incorporating an integrated circuit formed in a semiconductor material on a substrate, together with insulation and adhesive layers.

Measurement results from magnetic sensors can drift over time, providing varying measurement results even when exposed to the same magnetic field. For example, the magnetic field measurement results can be offset from a desired nominal value, the sensitivity can vary so that the measurement results are a multiple (either greater or less than one) of the desired value, or both. Such variation can be the result of changes in environmental conditions, for example temperature or humidity, or operational factors, such as vibration or aging. Moreover, devices can fail over time for similar reasons.

It is important, therefore, to include diagnostic capabilities to detect faults or failures in complex, safety-critical systems, such as automotive systems, so that repairs can be performed, or replacements can be provided for any faulty or failed devices. For example, WO2015038564 describes a method for verifying measurements from a magnetic Hall-effect sensor in a Hall-effect sensor system. In this approach, the Hall-effect sensor is excited with an excitation current having a first value. A first measurement corresponding to a voltage output of the Hall-effect sensor when the Hall-effect sensor is excited with the excitation current having the first value is obtained. Additionally, the Hall-effect sensor is excited with the excitation current having a second value, the second value different than the first value. A second measurement corresponding to a voltage output of the Hall-effect sensor when the Hall-effect sensor is excited with the excitation current having the second value is obtained. Operation of the Hall-effect sensor is then verified based at least on the first measurement and the second measurement.

Another approach to managing diagnostics in a magnetic field sensor is described in US20160252599A1. This design uses switches associated with a magnetic field sensor that provide error information. In particular, a device is provided that includes a magnetic field sensor, a plurality of switches associated with the magnetic field sensor, and a control circuit configured to control the plurality of switches and to provide at least one signal indicative of a fault based on operation of the switches.

However, these approaches and others like them do not necessarily operate the system under critical conditions, for example for operation close to a sensor system switching point or switching threshold and can therefore provide a false positive result under such critical conditions.

There is a need therefore, for circuits and methods in sensor systems that operate and test the sensor systems to provide more reliable diagnostics under critical test conditions.

SUMMARY OF THE INVENTION

Embodiments of the present invention provide a sensor device comprising a sensor for sensing an amount of a physical quantity, for example one or more environmental attributes such as a magnetic or electrical field, pressure, acceleration, or temperature, the sensor being adapted for providing and outputting discrete sensor signals formed in response to the sensed amount of the physical quantity. The sensor device can be a magnetic sensor device. The sensor device comprises a diagnostic test circuit for providing and optionally storing multiple diagnostic test signals, each diagnostic test signal representing a pre-determined desired sensor response to a particular amount of the physical quantity. The sensor device comprises a signal circuit with an input electrically connected to the sensor to receive a sensor signal from the sensor and an input connected to the diagnostic test circuit to receive diagnostic test signals from the diagnostic test circuit at different times. The signal circuit includes a select circuit for selecting between the sensor signal and the diagnostic test signal to form a signal circuit output or to modify the sensor signal to serve as a diagnostic test signal. The sensor device comprises a reference circuit for providing a first calibrated reference signal calibrated to a threshold amount of the physical quantity. (A threshold amount can also be or be considered as a threshold.) The sensor device comprises a comparator for receiving and comparing the first calibrated reference signal with the signal circuit output to form a comparison signal. If the signal circuit provides a sensor signal as the signal circuit output to the comparator, the comparison signal can be a sensor comparison signal. If the signal circuit provides a diagnostic test signal as the signal circuit output to the comparator, the comparison signal can be a diagnostic comparison signal. The sensor device further comprises a control circuit for controlling the signal circuit, the diagnostic test circuit, and the reference circuit to receive diagnostic comparison signals corresponding to diagnostic test signals and to produce a sensor device diagnostic signal in response to the diagnostic comparison signals. The control circuit is also adapted for controlling the signal circuit, the diagnostic test circuit, and the reference circuit to receive a sensor comparison signal corresponding to a sensor signal and to produce and output a sensor device sensor signal in response to the sensor comparison signal.

The multiple diagnostic test signals comprise a first diagnostic test signal, wherein the first diagnostic test signal represents an upper specification limit (USL) calculated by adding a predefined tolerance to the first calibrated reference signal and is preferably stored in the diagnostic test circuit and comprise a second diagnostic test signal, wherein the second diagnostic test signal represents a lower specification limit (LSL) calculated by subtracting a predefined tolerance from the first calibrated reference signal and is preferably stored in the diagnostic test circuit. The upper and lower specification limits define the diagnostic tolerance of the threshold. The predefined tolerances for the upper and lower specification limits can be the same or different.

In some embodiments of the present invention, only two diagnostic test signals are used to produce the sensor device diagnostic signal. In some embodiments of the present invention, the reference circuit provides one or more additional calibrated reference signal(s). Each additional calibrated reference signal is calibrated to an additional threshold amount of the physical quantity. For each additional calibrated reference signal an additional first diagnostic test signal is provided, wherein the additional first diagnostic test signal represents an additional upper specification limit calculated by adding a predefined tolerance to the additional calibrated reference signal and is preferably stored in the diagnostic test circuit, and an additional second diagnostic test signal is provided, wherein the additional second diagnostic test signal represents an additional lower specification limit calculated by subtracting a predefined tolerance from the additional calibrated reference signal and is preferably stored in the diagnostic test circuit.

Thus, in embodiments of the present invention, the calibrated reference signal is a first reference signal calibrated to a first threshold amount of the physical quantity, the USL represents a first upper specification limit (USL1), and the LSL represents a first lower specification limit (LSL1). An additional calibrated reference signal comprises a second reference signal calibrated to a second threshold amount of the physical quantity. The multiple diagnostic test signals can comprise a third diagnostic test signal, wherein the third diagnostic test signal represents a second upper specification limit (USL2) calculated by adding a predefined tolerance to the calibrated second reference signal and is preferably stored in the diagnostic test circuit. The multiple diagnostic test signals can also comprise a fourth diagnostic test signal, wherein the fourth diagnostic test signal represents a second lower specification limit (LSL2) calculated by subtracting a predefined tolerance from the second reference signal and is preferably stored in the diagnostic test circuit. The first and second upper and lower specification limits can define the diagnostic tolerance of the first and second thresholds, respectively. The predefined tolerances for the second upper and second lower specification limits can be the same or different. The predefined tolerances for the first threshold amount and the second threshold amount can be the same or different.

In some embodiments, the sensor device diagnostic signal is an error signal. In some embodiments, any combination of the sensor, the reference circuit, the diagnostic test circuit, and the signal circuit are differential circuits that process differential voltage signals provided on two wires. In some embodiments, any combination of the sensor, the reference circuit, the diagnostic test circuit, and the signal circuit are single-ended circuits that process single-ended voltage signals provided on one wire. Thus, the sensor, test, output, or reference signals can be single-ended voltage signals provided on one wire, or differential voltage signals provided on two wires. The comparator can be a differential comparator. The sensor device can comprise a latch-and-switch function implemented in the control circuit that controls the reference circuit. The latch has a switching point or switching threshold. The reference circuit provides the appropriate reference signals to the comparator.

In some configurations of the present invention, the sensor device comprises an optional amplifier that receives the signal circuit output from the signal circuit to form an amplified signal circuit output that is output to the comparator. In an embodiment, the control circuit controls the gain of the amplifier.

In some embodiments, the diagnostic test circuit stores a plurality of diagnostic test signals and the control circuit selects a desired diagnostic test signal output by the diagnostic test circuit. Similarly, in some embodiments, the reference circuit stores a plurality of reference signals and the control circuit selects a desired reference signal output by the reference circuit.

Any one or more of the diagnostic test circuit, the reference circuit, or the control circuit can include a non-volatile memory and memory-control circuitry for reading and writing to the memory. The memory of the reference circuit can store calibrated reference signals, the memory of the diagnostic test circuit can store diagnostic test signals, and the memory of the control circuit can store comparison signals or other control information. The memories can be digital memories and any of the circuits can include digital-to-analog conversion circuits. In some embodiments, the reference circuit stores a plurality of calibrated reference signals and the control circuit selects a desired calibrated reference signal output by the reference circuit. In some embodiments, the diagnostic test circuit stores a plurality of diagnostic test signals and the control circuit selects a desired diagnostic test signal output by the diagnostic test circuit.

Any one or more of the diagnostic test signals, the reference signals, the signal circuit outputs, the comparison signal, the sensor device sensor signal, or the sensor device diagnostic signal can be a digital signal, an analog signal such as a voltage, or a differential signal.

In some embodiments, the first or second diagnostic test signal is derived from the sensor signal.

Any one or more of the diagnostic test circuit, the reference circuit, or the control circuit can respond to environmental conditions, such as temperature, stress, or supply voltage, or historical use of the sensor device to modify any of the diagnostic test signals or the reference signals, for example to compensate for sensor device hysteresis such as magnetic hysteresis.

In some embodiments, the control circuit is adapted for combining multiple received comparison signals to form a combined comparison signal and the sensor device sensor signal or the sensor device diagnostic signal is responsive to the combined comparison signal.

In a second aspect, the present invention provides a method for operating and testing a sensor of a sensor device according to embodiments of the present invention. The method comprises performing diagnostics on the sensor and operating the sensor for sensing an amount of a physical quantity. The actions of performing diagnostics and operating the sensor share the signal circuit, the comparator, the reference circuit and at least part of the control circuit.

In embodiments of the present invention, a sensor diagnostic method comprises controlling the diagnostic test circuit with the control circuit to provide a first diagnostic test signal representing a desired sensor response to a first amount of a physical quantity, controlling the signal circuit with the control circuit to select the first diagnostic test signal and provide a first signal circuit output, controlling the reference circuit with the control circuit to provide a calibrated reference signal corresponding to a threshold of an amount of the physical quantity, comparing the calibrated reference signal and the first signal circuit output to produce a first comparison signal, controlling the diagnostic test circuit with the control circuit to provide a second diagnostic test signal, controlling the signal circuit with the control circuit to select the second diagnostic test signal and provide a second signal circuit output, comparing the reference signal and the second signal circuit output to produce a second comparison signal, and generating a sensor device diagnostic signal with the control circuit in response to the first and/or second comparison signals.

In embodiments of the present invention, operating the sensor may comprise controlling the signal circuit with the control circuit to select a sensor signal, comparing the sensor signal with a calibrated reference signal to produce a sensor comparison signal, and generating a sensor device sensor signal in response to the sensor comparison signal.

In embodiments of the present invention, the steps of performing diagnostics may be repeated after the steps of operating the sensor. The sensor may be operated a plurality of cycles before the steps of performing diagnostics are performed again.

The first diagnostic test signal can represent an upper specification limit (USL) calculated by adding a predefined tolerance to the calibrated reference signal and stored in the diagnostic test circuit and the second diagnostic test signal can represent a lower specification limit (LSL) calculated by subtracting a predefined tolerance from the calibrated reference signal and stored in the diagnostic test circuit. The upper and lower specification limits can define the diagnostic tolerance of the threshold.

In some methods of the present invention, additional calibrated reference signals corresponding to other thresholds (threshold amounts) of the physical quantity can be provided and compared to additional diagnostic test signals, for example third and fourth diagnostic test signals to produce additional comparison signals and the output diagnostic signal using the steps described.

In particular embodiments of the present invention, a sensing step can be performed in which the signal circuit is controlled to select a sensor signal from the sensor, receives a sensor comparison signal from the comparator, and outputs a signal representative of the comparison signal.

The sensing steps can be performed after, or before, the diagnostic steps. The sensing steps can be performed repeatedly between performing the diagnostic steps. In particular embodiments, a plurality of comparison signals form a combined comparison signal, such as an averaged comparison signal, that is used by the control circuit to output a sensor device sensor signal.

Embodiments of the present invention provide sensor devices having improved diagnostic capability using smaller and less expensive circuits.

BRIEF DESCRIPTION OF THE DRAWINGS

The foregoing and other objects, aspects, features, and advantages of the present invention will become more apparent and better understood by referring to the following description taken in conjunction with the accompanying drawings, in which.

Figure 1:
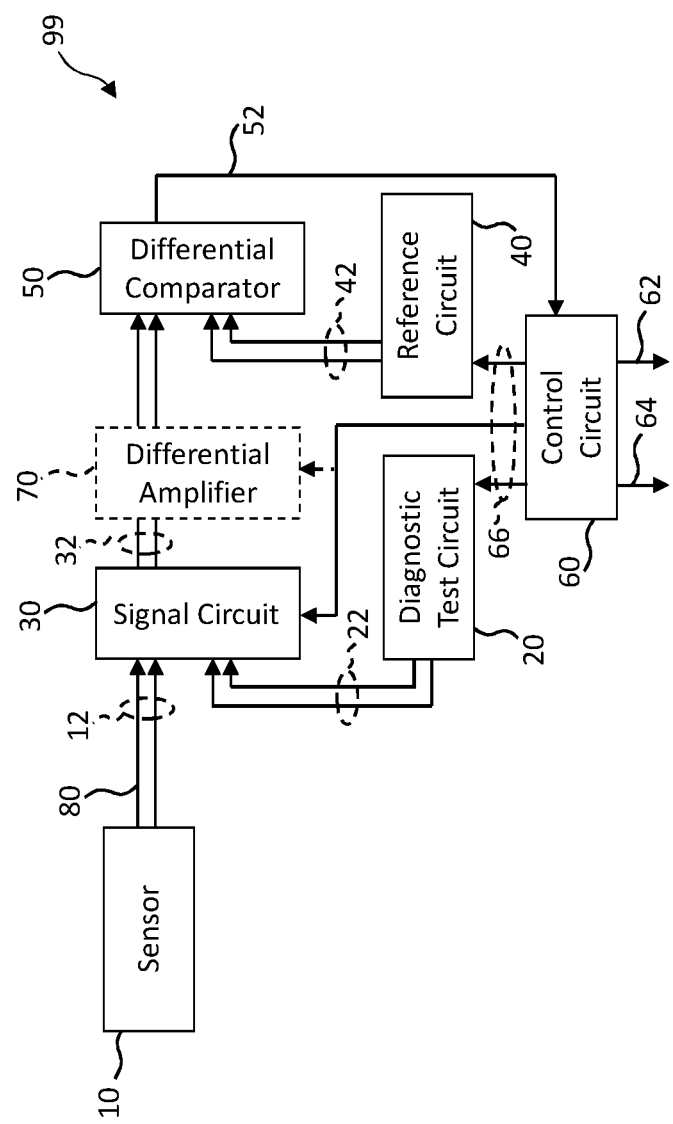
FIG. 1 is a schematic illustration of a sensor device according to an embodiment of the present invention.

The features and advantages of the present invention will become more apparent from the detailed description set forth below when taken in conjunction with the drawings, in which like reference characters identify corresponding elements throughout. The drawings are only schematic and are non-limiting. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

Embodiments of the present invention provide sensor devices having improved diagnostic capability using smaller and less expensive circuits. Referring to FIG. 1, a sensor device 99 comprises a sensor 10 for sensing a physical quantity, for example an environmental attribute or condition such as temperature or pressure, and for measuring an amount of the physical quantity. An amount of a physical quantity can be a magnitude, strength, or level of the physical quantity. The sensor 10 can be a bridge sensor. The sensor 10 provides a sensor signal 12 formed in response to a measured amount of the physical quantity, for example one or more environmental attributes such as a magnetic or electrical field, pressure, acceleration, or temperature. The sensor device 99 can be a magnetic sensor device 99 and the sensor 10 can be a magnetic sensor 10. The sensor signal 12 can be a differential signal (as shown in FIG. 1) carried on two wires 80 whose difference in voltage represents the sensor signal 12. Such differential signals are less susceptible to electrical noise. Alternatively (not illustrated), the sensor signal 12 can be carried by a single wire 80, for example a voltage signal whose value is the voltage with respect to a bias signal, for example a ground signal (not shown) provided to the sensor 10 or signal circuit 30. The sensor 10 provides different sensor signals 12 in response to different amounts of the physical quantity, that is the different sensor signals 12 each correspond to a different amount of the physical quantity.

Figure 2:
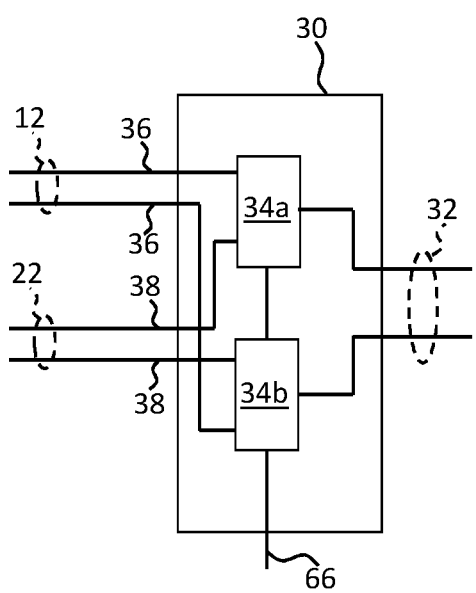
FIG. 2 is a schematic illustration of a signal circuit according to an embodiment of the present invention.

A diagnostic test circuit 20 provides and stores (or possibly obtains) multiple diagnostic test signals 22, each representing a pre-determined desired response to a corresponding amount of a physical quantity. The diagnostic test signals 22 can be, and are shown in FIG. 1 as, differential signals. Referring also to FIG. 2, a signal circuit 30 selects a diagnostic test signal 22 or a sensor signal 12 (as shown), or forms a diagnostic test signal 22 using the sensor signal 12 (for example by adding a dc bias, not shown) to produce a signal circuit output 32. The signal circuit 30 can be a multiplexor. Thus, the signal circuit 30 controllably provides at its output either the sensor signal 12 or a diagnostic test signal 22. In an embodiment corresponding to differential diagnostic test and sensor signals 22, 12, as in FIG. 1, the signal circuit 30 comprises inputs 36 connected to the wire(s) carrying the sensor signal 12 and inputs 38 connected to the wire(s) carrying the diagnostic test signal 22. The selection circuit (optionally two selection circuits 34a, 34b in case of a differential implementation) selects between the sensor signal 12 and the diagnostic test signal 22 to form the signal circuit output 32, also shown as a differential signal, in response to a signal circuit control signal 66.

A reference circuit 40 provides a calibrated reference signal 42 calibrated to a threshold amount of the physical quantity. A comparator 50 receives the signal circuit output 32 and compares it with the calibrated reference signal 42 to form a comparison signal 52. If the signal circuit 30 selects the diagnostic test signal 22, the comparison signal 52 can be a diagnostic comparison signal 52. If the signal circuit 30 selects the sensor signal 12, the comparison signal 52 can be a sensor comparison signal 52.

The output of a sensor device 99 according to embodiments of the present invention, depending on its mode of operation (which is determined by controlling the selector of the signal circuit 30), is either a sensor device sensor signal 64, or a sensor device diagnostic signal 62.

In some embodiments of the present invention, only two diagnostic test signals 22 are used to produce the sensor device diagnostic signal 62. The multiple diagnostic test signals 22 can comprise a first diagnostic test signal 22, wherein the first diagnostic test signal 22 represents an upper specification limit (USL—see below) calculated by adding a predefined tolerance to the calibrated reference signal 42, and is preferably stored in the diagnostic test circuit 20. The multiple diagnostic test signals can also comprise a second diagnostic test signal 22, wherein the second diagnostic test signal 22 represents a lower specification limit (LSL—see below) calculated by subtracting a predefined tolerance from the calibrated reference signal 42, and is preferably stored in the diagnostic test circuit 20. The upper and lower specification limits define the diagnostic tolerance of the threshold. The predefined tolerance values for the upper and lower specification limits can be the same value or different values.

The upper specification limit (USL) is equivalent to a measured value at which the sensor signal 12 of the sensor 10 is reliably above a switching threshold (for example by exceeding a switching point by a desired safety margin, so that systematic or statistical errors and fluctuations will not impact the sensor 10 measurement of the physical quantity) and the lower specification limit (LSL) is equivalent to a measured value at which the sensor 10 is reliably below the switching threshold (for example by being less than the switching point by a desired safety margin, so that systematic or statistical errors and fluctuations will not impact the sensor 10 measurement of the physical quantity). In such a case, the first diagnostic test signal 22 is such that the desired response above the threshold is achieved and the second diagnostic test signal 22 is such that the desired response below the threshold is achieved.

In some embodiments of the present invention, the reference circuit 40 provides one or more additional calibrated reference signals 42. Each additional calibrated reference signal 42 is calibrated to an additional threshold amount of the physical quantity and each additional reference signal 42 comprises an additional first diagnostic test signal 22, wherein the additional first diagnostic test signal 22 represents an additional upper specification limit calculated by adding a predefined tolerance to the additional calibrated reference signal 42 and stored in the diagnostic test circuit 20, and an additional second diagnostic test signal 22, wherein the additional second diagnostic test signal 22 represents an additional lower specification limit calculated by subtracting a predefined tolerance from the additional calibrated reference signal 42 and stored in the diagnostic test circuit 20.

Thus, in embodiments of the present invention, the calibrated reference signal 42 is a first reference signal calibrated to a first threshold amount of the physical quantity, the USL is a first upper specification limit (USL1), and the LSL is a first lower specification limit (LSL1). The multiple diagnostic test signals 22 also comprise a third diagnostic test signal 22, wherein the third diagnostic test signal 22 represents a second upper specification limit (USL2) calculated by adding a predefined tolerance to a second reference signal 42 calibrated to a second threshold amount of the physical quantity and stored in the diagnostic test circuit 20. The multiple diagnostic test signals can also comprise a fourth diagnostic test signal 22, wherein the fourth diagnostic test signal 22 represents a second lower specification limit (LSL2) calculated by subtracting a predefined tolerance from the second reference signal 42 and stored in the diagnostic test circuit 20. The first and second upper and lower specification limits can define the diagnostic tolerance of the first and second thresholds, respectively. The predefined tolerance values for the upper and lower specification limits can be the same value or different values and can be the same for the first and second diagnostic test signals 22, or different.

During normal operation (sensing mode), to avoid rapidly switching on and off at a single amount of the physical quantity, hysteresis can be employed so that the first threshold amount of the physical quantity, provided by the reference circuit 40, is different from, for example stronger or greater than, the second threshold amount of the physical quantity. In an embodiment of the present invention, during normal operation, the sensor 10 measurement value of the physical quantity is compared to two threshold values (an operational turn-on threshold, or BOP, and an operational turn-off threshold release point, or BRP).

By testing (diagnostic mode) the sensor device 99 the first and second amounts of the physical quantity (USL and LSL), a more reliable diagnostic representing the operating performance of the sensor device 99 at critical amounts of the physical quantity is obtained. In the case in which a sensor device 99 uses multiple thresholds, and in order to cope with systematic and/or statistical errors and fluctuations and avoid jittering, a reiterative test can be performed in which, in a first step a first threshold can be set to the LSL of the BOP operating point and the first reference signal is set to BOP and a second threshold can be set to the USL of the BOP operating point and the second reference signal is set to BOP. In a second step the first threshold can be set to the LSL of the BRP operating point and the first reference signal is set to BRP and the second threshold can be set to the USL of the BRP operating point and the second reference threshold is set to BRP.

The reference circuit 40 provides calibrated first and second reference signals 42 corresponding to each of the first and second threshold amounts of the physical quantity. A comparator 50 receives and compares a reference signal 42 and a signal circuit output 32 to form a comparison signal 52. The reference signal 42 and signal circuit output 32 can be differential signals and the comparator 50 can be a differential comparator 50 that produces a comparison signal 52 whose value corresponds to the difference, e.g. in voltage, of the input signals. Thus, in some embodiments of the present invention, any combination of the sensor 10, the reference circuit 40, the diagnostic test circuit 20, and the signal circuit 30 are differential circuits that process differential signals, e.g. voltage signals, provided on two wires. Alternatively, in some embodiments of the present invention, any combination of the sensor 10, the reference circuit 40, the diagnostic test circuit 20, and the signal circuit 30 are single-ended circuits that process single-ended voltage signals provided on one wire.

A control circuit 60 controls the signal circuit 30, the diagnostic test circuit 20, and the reference circuit 40 via control signals 66, and receives the comparison signal 52 to output a sensor device sensor signal 64 or a sensor device diagnostic signal 62, depending on whether the sensor device 99 is operating in a sensing mode (in which the signal circuit 30 selects the sensor signal 12 and the comparator 50 forms a sensor comparison signal 52) or in a diagnostic mode (in which the signal circuit 30 selects or forms the diagnostic test signal 22 and the comparator 50 forms a diagnostic comparison signal 52).

In some operating configurations of the present invention, the control circuit 60 controls the diagnostic test circuit 20, the signal circuit 30, and the reference circuit 40 to operate in a test or diagnostic mode. It then controls the diagnostic test circuit 20 to first provide the first diagnostic test signal 22, controls the signal circuit 30 to select the first diagnostic test signal 22 and provide a first signal circuit output 32, and controls the reference circuit 40 to provide the reference signal 42. The comparator 50 compares the first signal circuit output 32 and the reference signal 42 to form a first diagnostic comparison signal 52 that is provided to the control circuit 60. The control circuit 60 then controls the diagnostic test circuit 20 to provide the second diagnostic test signal 22, controls the signal circuit 30 to select the second diagnostic test signal 22 and provide a second signal circuit output 32, and controls the reference circuit 40 to provide the reference signal 42. The comparator 50 compares the second signal circuit output 32 and the reference signal 42 to form a second diagnostic comparison signal 52 that is provided to the control circuit 60. In the diagnostic mode, the control circuit 60 provides the sensor device diagnostic signal 62 responsive to the first and second diagnostic comparison signals 52, for example by checking whether the comparison signals 52 are as expected, and by raising an error flag if not.

In other operating configurations, the control circuit 60 controls the signal circuit 30 and the reference circuit 40 to operate in a sensing mode, in which the signal circuit 30 is controlled to select the sensor signal 12 and provide a signal circuit output 32. The reference signal 42 provided by the reference circuit 40 can be a differential signal with identical voltages or a bias signal, such as a ground, so that the comparator 50 inputs the signal circuit output 32 and outputs a comparison signal 52 similar to the signal circuit output 32 and thus to the sensor signal 12. In the sensing mode, the control circuit 60 provides the sensor device sensor signal 64 dependent on the comparison signal 52, corresponding to a sensed amount of the physical quantity. Generally, according to some embodiments of the present invention, the sensor device 99 will be controlled by the control circuit 60 to make multiple sensor measurements—hence to provide multiple sensor device sensor signals—between periodic diagnostic measurements.

The sensor 10 can be any of various sensors such as magnetic Hall-effect sensors or magneto-resistive sensors and can be provided, for example, in an integrated circuit or as separate integrated circuit components (such as bare die) mounted on a sensor substrate, such as a glass, ceramic, polymer or semiconductor substrate. One or more of the integrated circuit components can be disposed on the sensor substrate as bare die deposited by micro-transfer printing or, in the case of a semiconductor substrate, formed in or on the semiconductor substrate and electrically connected using wires 80 formed using photolithographic materials and methods. The sensor 10 can include electronic circuits, digital logic circuits, analog circuits, or mixed-signal circuits, or a combination of circuit types and electronic devices.

The diagnostic test circuit 20 can likewise include electronic circuits, digital logic circuits, analog circuits, or mixed-signal circuits, or a combination of circuit types and electronic devices. In some embodiments, the diagnostic test circuit 20 is a digital circuit, for example a CMOS circuit that includes a non-volatile memory for storing a plurality of pre-determined diagnostic test signal 22 values in a digital state. The diagnostic test circuit 20 can also include one or more digital-to-analog convertors for converting digital diagnostic test signal 22 values to a voltage or a differential voltage signal supplied to the signal circuit 30 over one or more wires. The diagnostic test circuit 20 can include memory-control circuitry that provides addresses to and reads values from the memory in response to control signals 66 provided by the control circuit 60.

Referring to FIGS. 1 and 2, the signal circuit 30 can likewise include electronic circuits, digital logic circuits, analog circuits, or mixed-signal circuits, or a combination of circuit types and electronic devices. In some embodiments, the signal circuit 30 is a digital circuit, for example a CMOS circuit. In other embodiments, the signal circuit 30 includes analog transistors. In a differential signal embodiment, the signal circuit 30 can include two selection circuits 34a, 34b. One selection circuit 34a selects either one of the sensor signals 12 or a corresponding one of the diagnostic test signals 22 and the other selection circuit 34b selects either the other one of the sensor signals 12 or the corresponding other one of the diagnostic test signal 22, both under the control of the control signal 66 provided by the control circuit 60. The selected signals are provided as signal circuit outputs 32. The signal circuit outputs 32 can be digital signals or analog signals, such as voltage signals.

In some embodiments of the present invention, the signal circuit output 32 is amplified to provide a greater range, for example a larger number of digital values or an increased voltage range or voltage difference (for differential signals). An amplifying circuit can be provided in the signal circuit 30 or as a separate amplifier circuit 70 that amplifies the signal circuit output 32 from the signal circuit 30 and provides an amplified signal circuit output. The amplifier 70 can be, as shown in FIG. 1, a differential amplifier 70 for a differential signal circuit output 32. In such an embodiment, the differential amplifier 70 receives the signal circuit outputs 32 from the signal circuit 30 to form amplified signal circuit outputs that are output to the differential comparator 50. The gain of the amplifier 70 can be controlled by the control circuit 60 through one or more wires carrying one or more control signals 66.

The reference circuit 40 can also include electronic circuits, digital logic circuits, analog circuits, or mixed-signal circuits, or a combination of circuit types and electronic devices. In some embodiments, the reference circuit 40 is a digital circuit, for example a CMOS circuit that includes a non-volatile memory for storing a plurality of reference signal 42 values in a digital state. The values can be pre-determined calibration values. The reference circuit 40 can include a digital-to-analog convertor for converting the digital reference signal 42 values to a voltage or a differential voltage supplied to the comparator 50. The reference circuit 40 can include memory-control circuitry that provides addresses to and reads values from the memory in response to control signals 66 provided by the control circuit 60. The reference circuit 40 can provide differential reference signals 42 (as shown in FIG. 1) or a single reference signal 42 (not shown), for example a voltage. The selected reference value can correspond to the selected test value in the diagnostic test circuit 20 and amount to the physical quantity so that the reference and test values are matched.

Whether amplified or not, the comparator 50 receives the signal circuit output 32 and the reference signal 42 and compares them, and outputs a comparison value 52 whose value corresponds to a difference between the output signal 32 and reference signal 42. If the output and reference signals 32, 42 are differential signals and the comparator 50 is a differential comparator 50, the differential comparator 50 first finds a difference between the differential signal circuit outputs 32 and a difference between the differential reference signals 42. The difference values are then compared to provide the comparison signal 52. Thus, in diagnostic mode a large comparison signal 52 represents a large error and a small comparison signal 52 represents a small error. In a digital embodiment, the differential comparator 50 can include digital circuits that perform arithmetic calculations to find differences between input digital values. In an analog embodiment, the differential comparator 50 can include operational amplifiers (Op Amps) that provide differences and comparisons to signals such as voltage signals.

The control circuit 60 can include digital logic circuits, analog circuits, or mixed-signal circuits, or a combination of circuit types and electronic devices. In some embodiments, the control circuit 60 includes a state machine or a central processing unit (e.g., a stored program machine with a program stored in a memory). The control circuit 60 can include a memory, drivers, digital logic circuits, and analog circuits. In some embodiments, the control circuit 60 includes environmental sensors and the control circuit 60 controls the diagnostic test circuit 20 and/or the reference circuit 40 in response to the sensed environment. For example, the diagnostic test signals 22 or/and the reference signals 42 can be adjusted or modified in response to the ambient temperature, humidity, vibration, or other environmental attributes or conditions. Moreover, in some embodiments, the control circuit 60 can adapt the sensor device sensor signal 64 or the sensor device diagnostic signal 62 in response to the environmental conditions using a pre-determined calibration of the sensor 10 and the sensor device components under those environmental conditions. In same or other embodiments, the control circuit 60 can store a history of use and conditions for the sensor device 99 and can adapt the sensor device sensor signal 64 or the sensor device diagnostic signal 62 in response to the history of use and conditions. For example, components can degrade substantially predictably over time under known environmental conditions or a known pattern of use and the sensor device sensor signal 64 or the sensor device diagnostic signal 62 can be adjusted in response to the use or environmental condition history.

In same or yet other embodiments of the present invention, multiple comparison signals 52, for example recorded over time, may be stored in a memory in the control circuit 60 and are combined, for example by averaging, to form a combined comparison signal that has less noise or is more accurate or precise. The sensor device sensor signal 64 can be responsive to the combined comparison signal. In some embodiments, multiple comparison signals 52 are made and stored in a diagnostic mode and the multiple comparison signals 52 are combined, for example by averaging, to provide an improved sensor device diagnostic signal 62.

In embodiments of the present invention, the amount of circuitry required to provide both diagnostic and sensing is reduced by largely using the same circuits for both functions and is more thoroughly tested by using most of the same components in the same way in both modes.

Portions or all of the control circuit 60, diagnostic test circuit 20, signal circuit 30, reference circuit 40, and differential comparator 50 can be provided in one or more integrated circuits or can include discrete electronic components. A single integrated circuit can include circuits that provide the control function of the control circuit 60, diagnostic test functions of the diagnostic test circuit 20, and portions or all of the reference circuit 40. Alternatively, multiple integrated circuits can incorporate all or portions of the control circuit 60, diagnostic test circuit 20, and the reference circuit 40 distributed among the multiple integrated circuits in any of many ways.

The various components of the sensor device 99 can be, for example, provided in electronic circuits, integrated circuits, or discrete electronic devices that are electrically connected with wires. Any one or all of the various components can be disposed on a printed circuit board or on a semiconductor substrate, or any one or all of the various components can be integrated as a circuit in or on the semiconductor substrate, or some combination can be made of integrated circuits provided on the semiconductor substrate and circuits formed in or on the semiconductor substrate. Any one or all of the various components can be provided in packaged integrated circuits or in bare die that are micro-transfer printed onto the semiconductor substrate or other substrate. Wires can be provided using photolithographic methods and materials to connect the various components, integrated circuit dies, or circuits integrated on the semiconductor substrate.

Figure 3:
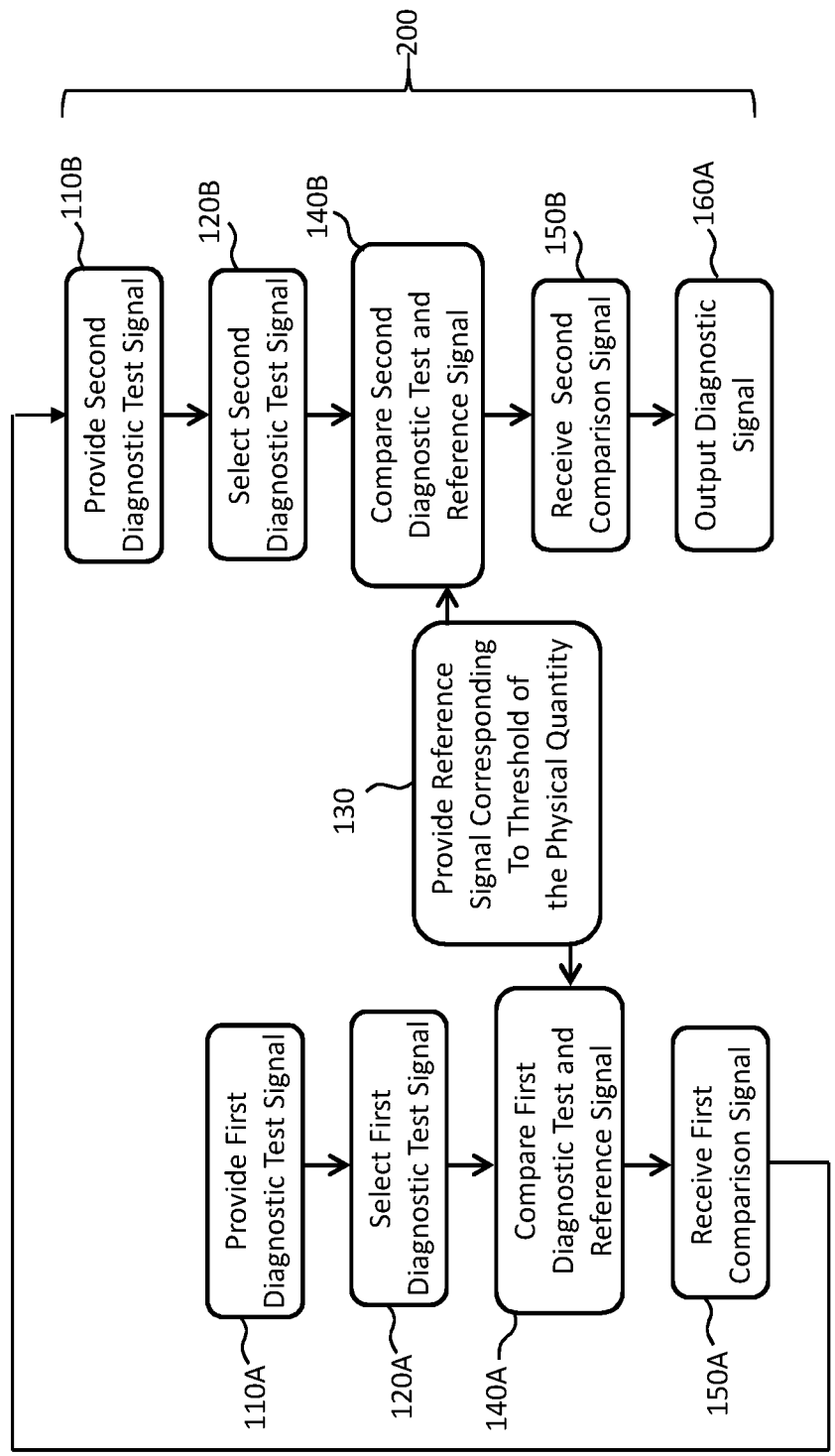
FIG. 3 is a flow chart of a sensor diagnostic method according to an embodiment of the present invention.

Referring to FIG. 3, in some embodiments of the present invention, a sensor diagnostic method comprises controlling the diagnostic test circuit 20 by the control circuit 60 to provide a first diagnostic test signal 22 (for instance USL or SLS) representing a desired response to a first amount of the physical quantity in step 110A and the signal circuit 30 is controlled by the control circuit 60 to select the first diagnostic test signal 22 in step 120A and produce a first signal circuit output 32. In step 130, the control circuit 60 controls the reference circuit 40 to provide a reference signal 42 corresponding to an amount of the physical quantity, for example a high or low switching amount. The comparator 50 receives the reference signal 42 and first signal circuit output 32 in step 140A to produce a first comparison signal 52 that is received and stored by the control circuit 60 in step 150A. The diagnostic test circuit 20 is then controlled by the control circuit 60 to provide a second diagnostic test signal 22 representing a desired response to the second amount, different from the first amount, of the physical attribute in step 110B and the signal circuit 30 is controlled by the control circuit 60 to select the second diagnostic test signal 22 in step 120B and produce a second signal circuit output 32. The comparator 50 receives the reference signal 42 and second signal circuit output 32 in step 140B to produce a second comparison signal 52. The control circuit 60 receives the second comparison signal 52 in step 150B and can then evaluate, compare, or process the first and second comparison signals 52 to produce and output or otherwise use the sensor device diagnostic signal 62 in step 160A. For example, the sensor device diagnostic signal 62 can be supplied to an external control system or can be used to modify the behavior of the sensor device 99 itself, for example by modifying its operating characteristics or to turn the sensor device diagnostic signal 62 off. The process can then be repeated for a second reference signal 42 and third and fourth diagnostic test signals 22.

Figures 4, 5:
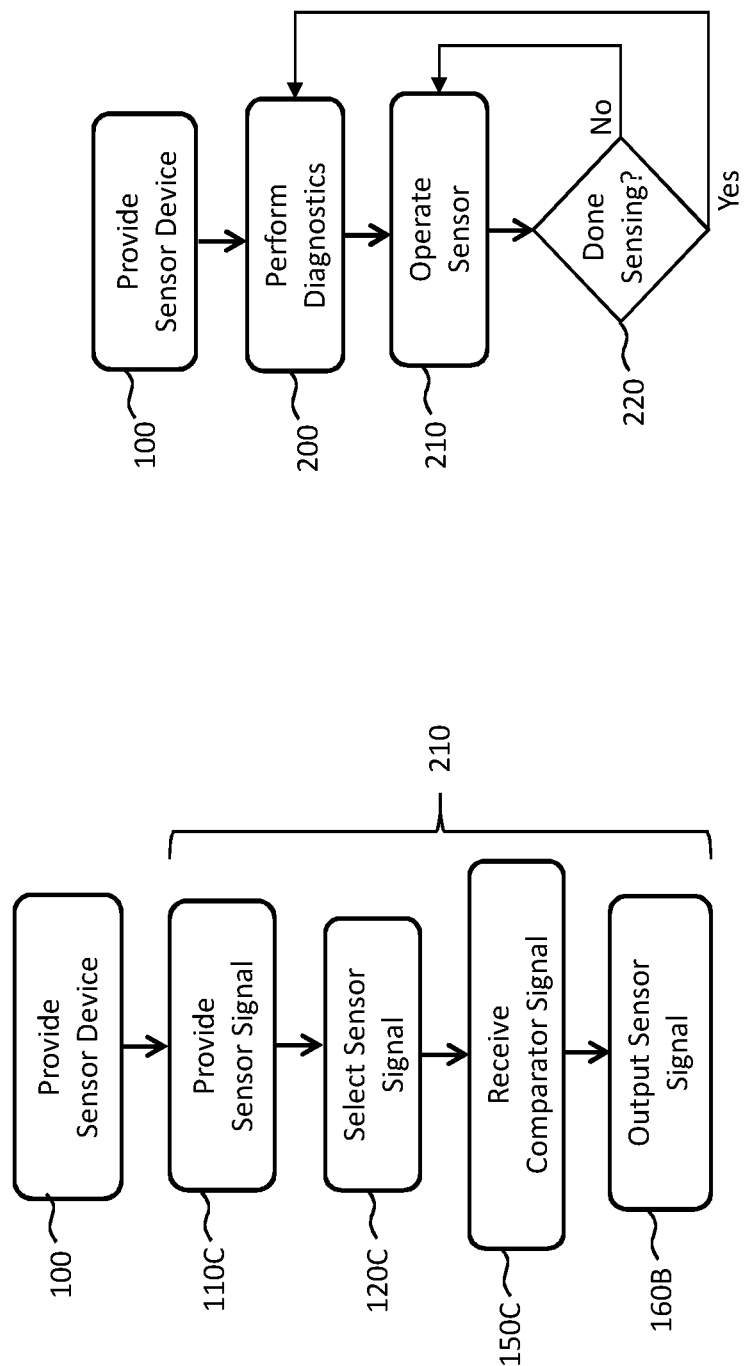
FIG. 4 is a flow chart of a sensor method according to an embodiment of the present invention.
FIG. 5 is a flow chart of sequentially driven diagnostic and sensor methods wherein the sensor device operates to sense amounts of a physical quantity and occasionally and periodically the sensor device is tested to ensure correct operation, according to an embodiment of the present invention.

Referring to FIG. 4 in sensor methods of the present invention, a sensor device 99 is provided in step 100. The sensor 10 produces a sensor signal 12 in step 110C that is selected by the signal circuit 30 under the control of the control circuit 60 in step 120C. If a differential signal circuit output 32 is used, the differential comparator 50 forms a difference signal that is output as the sensor comparison signal 52. If a non-differential signal is used, the comparator 50 uses the signal circuit output 32 as an amount of the physical attribute for the sensor comparison signal 52. The sensor comparison signal 52 is received by the control circuit 60 in step 150C and is evaluated, compared, or processed by the control circuit 60 to produce the sensor device sensor signal 64 in step 160B.

The diagnostic and the sensing modes can each be operated at arbitrary times or for arbitrary periods. However, in some embodiments of the present invention and referring to FIG. 5, a sensor device 99 is provided in step 100. In step 200, including steps 110A-150A and 110B-150B and 160A from FIG. 3, the sensor device 99 enters the diagnostic mode and a sensor device diagnostic signal 62 is output by the control circuit 60. In step 210, including steps 110C-150C and 160B from FIG. 4, the sensor device 99 enters the sensing mode and a sensor device sensor signal 64 is output by the control circuit 60. The sensor device 99 stays in the sensing mode until it is done (step 220), for example for a predetermined period of time or for a predetermined number of sensor cycles by returning to step 210. At that point, the sensor device 99 leaves the sensing mode and enters the diagnostic mode, performing step 200. When the diagnostic test is complete, the sensor device 99 leaves the diagnostic mode and re-enters the sensing mode, step 210. Thus, the sensor device 99 normally operates to sense amounts of a physical quantity (as shown in FIG. 4) and occasionally or periodically is tested (as shown in FIG. 3) to ensure correct operation.

In an embodiment of the present invention, multiple comparison signals 52 are combined, for example by averaging multiple comparison signals 52 taken between individual diagnostic steps 200, to produce a combined comparison signal 52 that is used by the control circuit 60 to output a sensor device sensor signal 64. Alternatively, multiple first and second comparison signals 52 taken in diagnostic mode are combined to produce a combined comparison signal 52 that is used by the control circuit 60 to output a sensor device diagnostic signal 62.

Embodiments of the present invention can be constructed by providing a substrate and mounting the sensor 10 on the substrate. The substrate can be a component of another device or structure. In some embodiments, the diagnostic test circuit 20, the signal circuit 30, the reference circuit 40, the comparator 50, and the control circuit 60 are provided in one or more integrated circuits, either packaged or as bare die, and disposed on the substrate surface. The sensor 10 and integrated circuits can be disposed on the substrate surface by micro-transfer printing them from corresponding source wafers onto the substrate surface. Alternatively, the substrate surface can be or include a semiconductor layer and one or more or any portion of each of the diagnostic test circuit 20, the signal circuit 30, the reference circuit 40, the differential comparator 50, and the control circuit 60 are formed in the semiconductor layer and electrically connected together or with any integrated circuit disposed on the substrate surface using wires on the substrate surface, for example using photolithographic or printed circuit board methods and materials.

The substrate can be one of many substrates with a surface capable of supporting or receiving the sensor 10 and integrated circuits, for example a glass, plastic, ceramic, or semiconductor substrate with two opposing relatively planar and parallel sides. The substrate can have a variety of thicknesses, for example 10 microns to several millimeters. The substrate can be a portion or surface of another device and can include electronic circuitry. The sensor 10 can be any of a variety of sensors, for example a Hall effect sensor or magneto-resistive sensor. The sensor 10 can be provided in a packaged or unpackaged integrated circuit or in a circuit formed or disposed on, in, or in direct contact with the substrate, a surface of the substrate, or a layer on the substrate.

If the sensor 10 or one or more or any portion of each of the diagnostic test circuit 20, the signal circuit 30, the reference circuit 40, the differential comparator 50, and the control circuit 60 are micro-transfer printed to the substrate or layers on the substrate (e.g., dielectric layers) they can be electrically connected to each other with wires as desired through vias in any intervening layers (such as the dielectric layer) as is commonly done in the integrated circuit and printed circuit board arts. Alternatively, the sensor 10 or any integrated circuits are surface mount devices and disposed using surface mount techniques.

Embodiments of the sensor device 99 of the present invention can be operated by providing electrical power to the sensor 10 and any one or more of the diagnostic test circuit 20, the signal circuit 30, the reference circuit 40, the comparator 50, and the control circuit 60. Responsive to the electrical power, the control circuit 60 operates the other elements of the sensor device 99 as described with respect to FIGS. 3, 4, and 5.

Methods of forming micro-transfer printable structures are described, for example, in the paper *AMOLED Displays using Transfer-Printed Integrated Circuits* (Journal of the Society for Information Display, 2011, DOI #10.1889/ JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, the relevant content of each of which is hereby incorporated by reference. Micro-transfer printing using compound micro-assembly structures and methods can also be used with the present invention, for example, as described in U.S. patent application Ser. No. 14/822,868, filed Aug. 10, 2015, entitled Compound Micro-Assembly Strategies and Devices, the relevant content of which is hereby incorporated by reference. In an embodiment, the sensor device 99 is a compound micro-assembled device. Additional details useful in understanding and performing aspects of the present invention are described in U.S. patent application Ser. No. 14/743,981, filed Jun. 18, 2015, entitled Micro Assembled LED Displays and Lighting Elements, the relevant content of which is hereby incorporated by reference in its entirety.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in."

Having described certain embodiments, it will now become apparent to one of skill in the art that other embodiments incorporating the concepts of the invention may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A sensor device, comprising:
   a sensor for sensing an amount of a physical quantity, the sensor being adapted for providing a sensor signal formed in response to the sensed amount of the physical quantity;
   a reference circuit for providing a first calibrated reference signal calibrated to a threshold amount of the physical quantity;
   a diagnostic test circuit for providing multiple diagnostic test signals, each diagnostic test signal representing a pre-determined desired sensor response to a particular amount of the physical quantity;
   a signal circuit for providing either the sensor signal or a diagnostic test signal as a signal circuit output;
   a comparator for receiving and comparing the signal circuit output with the first calibrated reference signal to form a comparison signal; and
   a control circuit:
   i) for controlling the signal circuit, the diagnostic test circuit, and the reference circuit to receive diagnostic comparison signals corresponding to diagnostic test signals and to produce a sensor device diagnostic signal in response to the diagnostic comparison signals; and
   ii) for controlling the signal circuit, the diagnostic test circuit, and the reference circuit to receive a sensor comparison signal corresponding to a sensor signal and to produce and output a sensor device sensor signal in response to the sensor comparison signal; and,
   wherein
   a) the multiple diagnostic test signals comprise a first diagnostic test signal, wherein the first diagnostic test signal represents an upper specification limit calculated by adding a predefined tolerance to the first calibrated reference signal;
   b) the multiple diagnostic test signals comprise a second diagnostic test signal, wherein the second diagnostic test signal represents a lower specification limit calculated by subtracting a predefined tolerance from the first calibrated reference signal; and
   c) the upper and lower specification limits define the diagnostic tolerance of the threshold amount.

2. The sensor device of claim 1, wherein only two diagnostic test signals are used to produce the sensor device diagnostic signal.

3. The sensor device of claim 1, wherein the reference circuit provides one or more additional calibrated reference signal(s) each calibrated to an additional threshold amount of the physical quantity and wherein, for each additional calibrated reference signal, are provided:
   i) an additional first diagnostic test signal, wherein the additional first diagnostic test signal represents an additional upper specification limit calculated by adding a predefined tolerance to the additional calibrated reference signal; and
   ii) an additional second diagnostic test signal, wherein the additional second diagnostic test signal represents an additional lower specification limit calculated by subtracting a predefined tolerance from the additional calibrated reference signal.

4. The sensor device of claim 3, wherein:
the first calibrated reference signal is calibrated to a first threshold amount of the physical quantity, the upper specification limit represents a first upper specification limit and the lower specification limit represents a first lower specification limit;
an additional calibrated reference signal comprises a second reference signal calibrated to a second threshold amount of the physical quantity; and
    a) the multiple diagnostic test signals comprise a third diagnostic test signal, wherein the third diagnostic test signal represents a second upper specification limit calculated by adding a predefined tolerance to the calibrated second reference signal and stored in the diagnostic test circuit;
    b) the multiple diagnostic test signals comprise a fourth diagnostic test signal, wherein the fourth diagnostic test signal represents a second lower specification limit calculated by subtracting a predefined tolerance from the second reference signal and stored in the diagnostic test circuit; and
    c) the first and second upper and lower specification limits define the diagnostic tolerance of the first and second thresholds, respectively.

5. The sensor device of claim 1, comprising an amplifier adapted for receiving the signal circuit output from the signal circuit to form an amplified signal circuit output that is output to the comparator.

6. The sensor device of claim 5, wherein the control circuit is adapted for controlling the gain of the amplifier.

7. The sensor device of claim 1, wherein the comparator is a differential comparator.

8. The sensor device of claim 1, wherein the diagnostic test circuit or the control circuit is adapted to respond to environmental conditions or historical use to modify one or more of the multiple diagnostic test signals.

9. The sensor device of claim 1, wherein the reference circuit or the control circuit is adapted to respond to environmental conditions or historical use to modify one or more of the calibrated reference signals, or
wherein the control circuit is adapted for combining multiple comparison signals to form a combined comparison signal and wherein the sensor device sensor signal is responsive to the combined comparison signal.

10. The sensor device of claim 1, wherein the reference circuit is adapted for storing a plurality of calibrated reference signals and the control circuit is adapted for selecting a desired calibrated reference signal output by the reference circuit, or
wherein the diagnostic test circuit is adapted for storing a plurality of diagnostic test signals and the control circuit is adapted for selecting a desired diagnostic test signal output by the diagnostic test circuit.

11. A method adapted to operate and test a sensor of a sensor device according to claim 1, the method comprising performing diagnostics on the sensor and operating the sensor for sensing an amount of a physical quantity,
wherein performing diagnostics and operating the sensor share the signal circuit, the comparator, the reference circuit and at least part of the control circuit.

12. A method according to claim 11, wherein performing diagnostics comprises:
    a) controlling the diagnostic test circuit with the control circuit to provide a first diagnostic test signal;
    b) controlling the signal circuit with the control circuit to select the first diagnostic test signal and provide a first signal circuit output;
    c) controlling the reference circuit with the control circuit to provide a calibrated reference signal calibrated to a threshold amount of the physical quantity;
    d) comparing the calibrated reference signal and the first signal circuit output to produce a first comparison signal;
    e) controlling the diagnostic test circuit with the control circuit to provide a second diagnostic test signal;
    f) controlling the signal circuit with the control circuit to select the second diagnostic test signal and provide a second signal circuit output;
    g) comparing the calibrated reference signal and the second signal circuit output to produce a second comparison signal;
    h) generating a sensor diagnostic signal in response to the first and second comparison signals.

13. The method of claim 11, wherein operating the sensor comprises:
    g) controlling the signal circuit with the control circuit to select a sensor signal;
    h) comparing the sensor signal with a calibrated reference signal to produce a sensor comparison signal;
    i) generating a sensor device sensor signal in response to the sensor comparison signal.

14. The method of claim 12, comprising:
repeating steps a) through f) after performing steps g) through i).

15. The method of claim 12, comprising:
repeating steps g) through i) several times and then performing steps a) through f).

* * * * *